(12) United States Patent
Low et al.

(10) Patent No.: US 9,165,862 B1
(45) Date of Patent: Oct. 20, 2015

(54) SEMICONDUCTOR DEVICE WITH PLATED THROUGH HOLES

(71) Applicants: Boon Yew Low, Petaling Jaya (MY); Ngak Thong Teo, Kuala Lumpur (MY)

(72) Inventors: Boon Yew Low, Petaling Jaya (MY); Ngak Thong Teo, Kuala Lumpur (MY)

(73) Assignee: FREESCALE SEMICONDUCTOR, INC., Austin, TX (US)

( * ) Notice: Subject to any disclaimer, the term of this patent is extended or adjusted under 35 U.S.C. 154(b) by 0 days.

(21) Appl. No.: 14/477,885

(22) Filed: Sep. 5, 2014

(51) Int. Cl.
*H01L 23/48* (2006.01)
*H01L 23/498* (2006.01)
*H01L 23/532* (2006.01)
*H01L 23/31* (2006.01)
*H01L 21/768* (2006.01)
*H01L 21/288* (2006.01)
*H01L 21/56* (2006.01)

(52) U.S. Cl.
CPC .......... *H01L 23/481* (2013.01); *H01L 21/2885* (2013.01); *H01L 21/561* (2013.01); *H01L 21/566* (2013.01); *H01L 21/76802* (2013.01); *H01L 21/76879* (2013.01); *H01L 23/3107* (2013.01); *H01L 23/49838* (2013.01); *H01L 23/49866* (2013.01); *H01L 23/53228* (2013.01)

(58) Field of Classification Search
None
See application file for complete search history.

(56) References Cited

U.S. PATENT DOCUMENTS

| | | | |
|---|---|---|---|
| 6,562,272 B1 | 5/2003 | Chang et al. | |
| 2002/0185305 A1* | 12/2002 | Chiang | H01L 23/60 174/257 |
| 2008/0044511 A1 | 2/2008 | Chang et al. | |
| 2014/0098506 A1 | 4/2014 | Malik et al. | |

* cited by examiner

*Primary Examiner* — Kyoung Lee
(74) *Attorney, Agent, or Firm* — Charles E. Bergere

(57) ABSTRACT

A semiconductor device package such a as Ball Grid Array (BGA), includes a die attached to a substrate. The substrate has a series of plated through holes (PTH) that include a copper pad at each of their ends. The PTH are located in a mold gate region at a corner of the substrate beyond the periphery of the die. Each PTH contains a rivet. The PTH with the pads and rivets stabilize the substrate at the mold gate region, which reduces the possibility of substrate delamination upon degating following an encapsulation process.

16 Claims, 4 Drawing Sheets

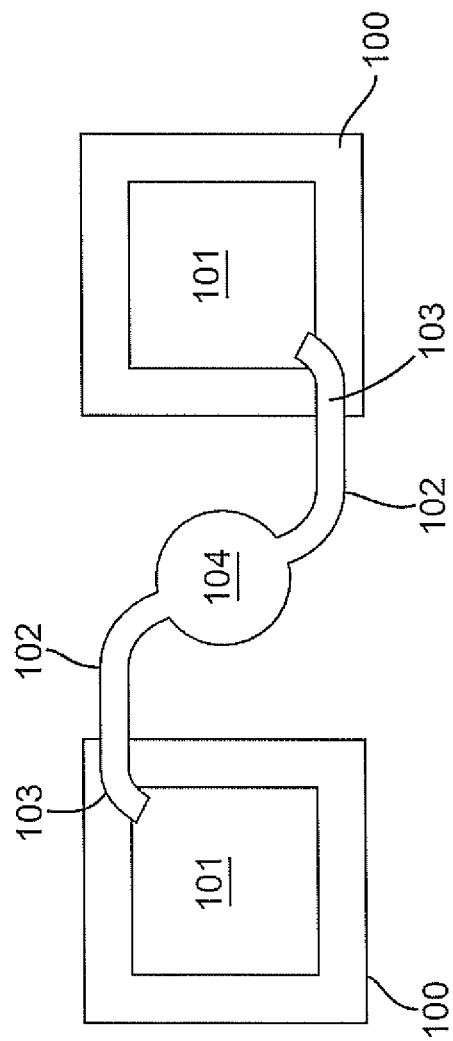
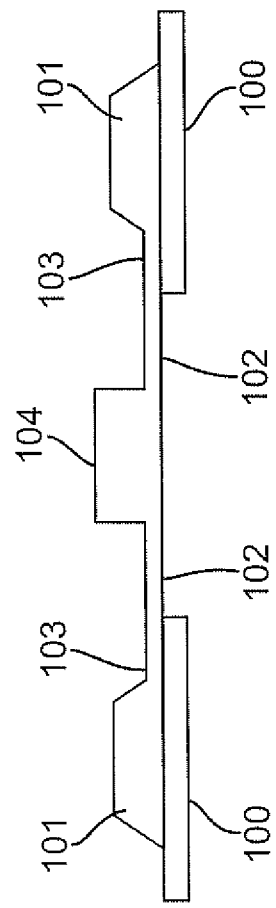
FIG. 1
PRIOR ART
FIG. 2
PRIOR ART

SEMICONDUCTOR DEVICE WITH PLATED THROUGH HOLES

BACKGROUND OF THE INVENTION

The present invention relates to semiconductor device manufacturing and packaging and more particularly to delamination-resistant array type packages and their method of manufacture.

One type of known semiconductor package includes a multi-layer circuit board comprising a core and one or more dielectric layers, conducting layers and pads. A semiconductor die may be flip-chip connected to external conductive layers of the board with solder balls. Vias (small openings) are made in the dielectric layers to allow conductive connections between layers and typically comprise two pads on different layers of the board that are electrically connected by a drilled hole. The hole is made conducting by electroplating or by it lining with a conducting tube or a rivet. A so-called "plated through hole" (PTH) typically provides vertical connections through the core to the conductive layers of the circuit board. Plated through holes are drilled using lasers or a mechanical drill.

A known array type manufacture of multiple devices is used on BGA (Ball Grid Array) packages where a plurality of dies is disposed on a substrate in the arrangement of a matrix array. The substrate may be a copper clad glass fiber laminate. The dies are connected to signal terminals of the substrate by wirebonds and then the dies are encapsulated in a protective coating using a molding process. In the molding process, a plurality of substrates with the dies is placed between upper and lower molds. When the upper and lower molds are combined, gaps between the two molds and the die substrates are reserved as runners and gates. Colloidal particles are placed at the center of the mold which are subsequently melted to produce a compound flow which is injected into the mold cavities through the runners and gates so as to cover the dies. FIG. 1 shows two die substrates 100 (in plan view) on completion of the molding process. FIG. 2 shows an end view of the substrates and dies. Sealing compound regions 101 (covering the individual dies), runner regions 102, mold gate regions 103, and a residue 104 are formed after the compound flow is cured. The runner regions 102, the mold gates 103 and the residue 104 comprise a cull which needs to be stripped by a degating process. In a typical degating process, a plunger exerts a force on the residue 104 which results in the cull breaking away. A problem of the degating process is delamination of the substrate at the regions of the mold gates 103. For instance, an outer copper layer of the substrate may stick to the mold gate region and peel way on degating, leaving fibers of the substrate exposed. Delamination can even occur when the mold gate region of the substrate has been gold plated in an attempt to aid mold gate release. Delamination is undesirable as it can lead to moisture ingress into the package with a resulting degradation of performance or even failure of the packaged semiconductor device.

Thus it would be advantageous to provide a package which is less susceptible to delamination on degating.

BRIEF DESCRIPTION OF THE DRAWINGS

The invention, together with objects and advantages thereof, may best be understood by reference to the following description of preferred embodiments together with the accompanying drawings in which:

FIG. 1 is a plan view of two substrate and die arrangements joined by a molding cull;

FIG. 2 is a side view of the arrangements of FIG. 1;

DETAILED DESCRIPTION OF PREFERRED EMBODIMENTS

Figure 3:
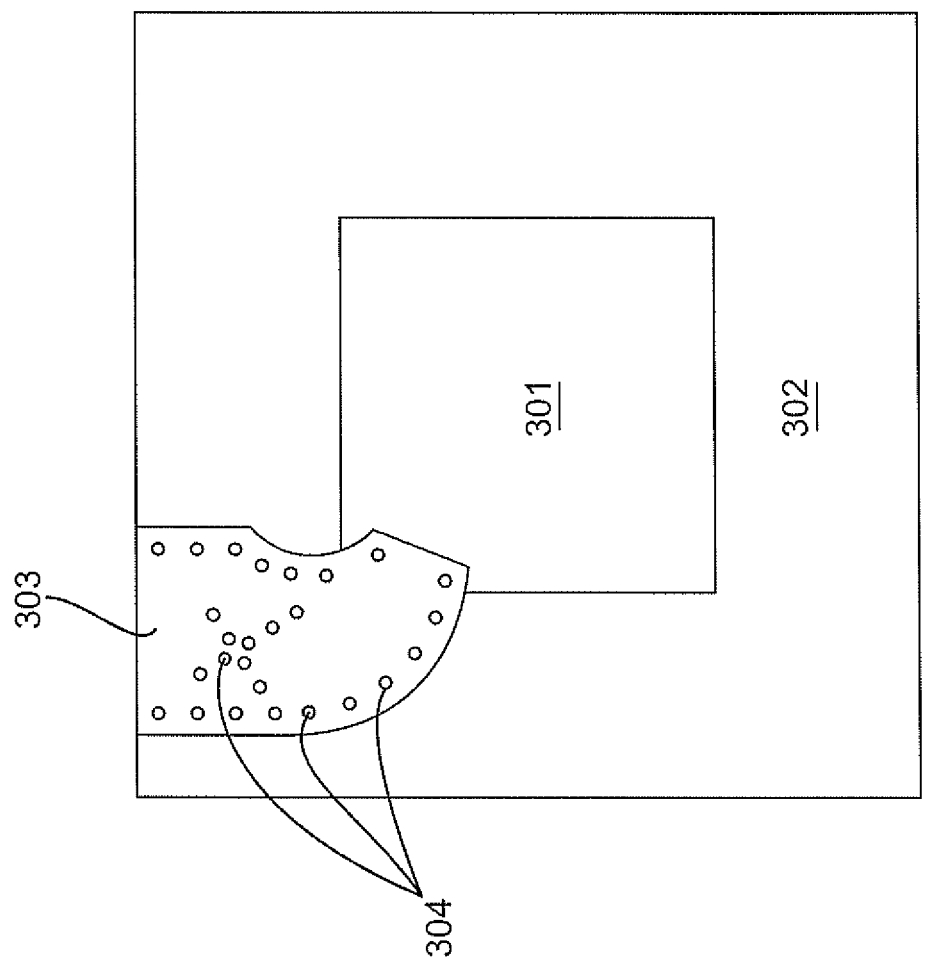
FIG. 3 is a plan view of a substrate and die arrangement in accordance with an embodiment of the invention and prior to encapsulation.

The detailed description set forth below in connection with the appended drawings is intended as a description of presently preferred embodiments of the invention, and is not intended to represent the only forms in which the present invention may be practised. It is to be understood that the same or equivalent functions may be accomplished by different embodiments that are intended to be encompassed within the spirit and scope of the invention. In the drawings, like numerals are used to indicate like elements throughout. Furthermore, terms "comprises," "comprising," or any other variation thereof, are intended to cover a non-exclusive inclusion, such that module, circuit, device components, structures and method steps that comprises a list of elements or steps does not include only those elements but may include other elements or steps not expressly listed or inherent to such module, circuit, device components or steps. An element or step proceeded by "comprises . . . a" does not, without more constraints, preclude the existence of additional identical elements or steps that comprises the element or step.

In one embodiment, the present invention provides for a semiconductor device package. The package comprises a substrate and a die mounted on the substrate. The substrate includes a peripheral region extending beyond a periphery of the die and defining a mold gate region. The mold gate region includes at least one plated through hole which includes a pad at each of its ends.

In another embodiment, the present invention provides for a semiconductor device package comprising a substrate and a die mounted on the substrate, wherein the substrate includes a peripheral region extending beyond a periphery of the die and defining a mold gate region, and wherein the mold gate region includes at least one through hole containing a rivet.

In another embodiment, the present invention provides for a method for manufacturing a semiconductor device package, the method comprising: mounting a die on a substrate so that a peripheral region of the substrate extends beyond the die to form a mold gate region; and drilling at least one through hole in the mold gate region.

Advantageously, the plating in the through hole in conjunction with the pads at each end or alternatively, the rivet contained in the through hole serves to stabilize the upper layer of the substrate during the degating process following encapsulation of the die. Hence a package in accordance with the invention is less susceptible to delamination at the mold gate regions. Preferably, a series of through holes is provided in the mold gate region.

Referring now to FIG. 3 there is illustrated a substrate and die arrangement prior to encapsulation. A semiconductor die 301 is mounted on a substrate 302. The substrate has a peripheral region which extends beyond the die. This peripheral region defines a mold gate region 303. The substrate 302 is, in this example, a copper laminate comprising an inorganic filler and resin arrangement with embedded glass fibres. It typically includes one or more cores, one or more dielectric layers and conducting layers and contact pads of copper. In one embodiment, the surface of the substrate 302 on which the die 301 is mounted includes a copper layer. In another embodiment, the mold gate region 103 is gold plated. The substrate includes a series of drilled holes 304 located in the mold gate region 303. In one example, the drilled holes are plated through holes which include a pad at each end. Typically, the plated through holes are electroplated with copper using a known technique and the pads are also copper. In another embodiment, the drilled holes contain rivets, made from copper for example.

Figure 4:
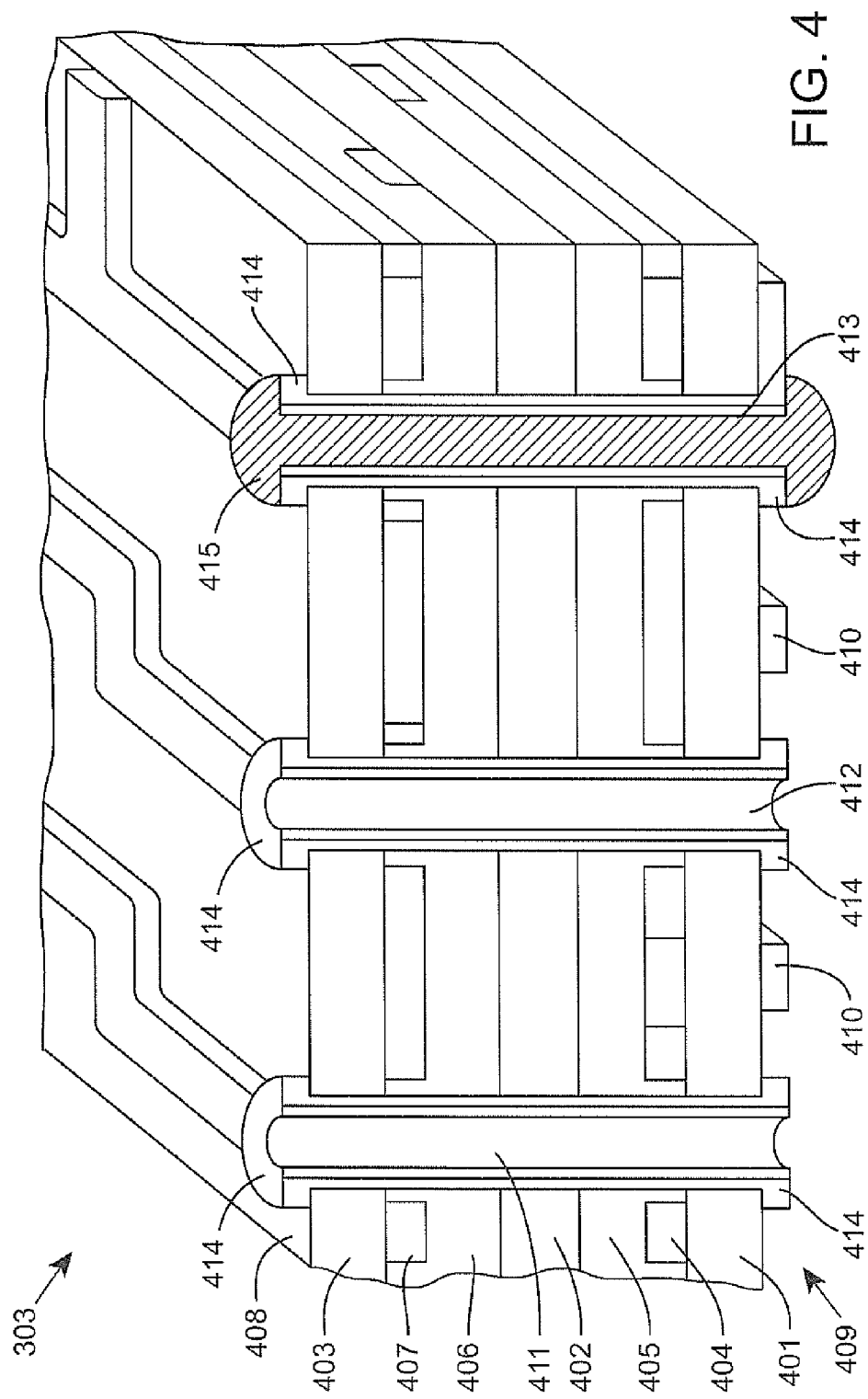
FIG. 4 is a three-dimensional, cross-sectional view of a portion of the substrate of FIG. 3.

Referring now to FIG. 4, there is illustrated a schematic, perspective, cross-sectional view of a portion of the mold gate region 303 of the substrate 302 of FIG. 1. The substrate is a laminate which includes three internal cores; a lower core 401, an intermediate core 402 and an upper core 403. The lower core 401 and intermediate core 402 are separated by a first copper layer 404 which serves as a voltage supply plane and by a first intermediate dielectric layer 405. The intermediate core 402 and the upper core 403 are separated by a second intermediate dielectric layer 406 and second copper layer 407 which serves as a ground plane. An upper surface 408 of the mold gate region 303 is copper clad and a lower surface 409 of the mold gate region 303 includes copper tracks 410. The mold gate region 303 includes a series of plated through holes. Three plated through holes 411, 412, 413 are shown in FIG. 4. Each plated through hole is electroplated with copper and includes a copper pad 414 at each of its ends. In this example, one of the plated through holes 413 has inserted therein a copper rivet 415. In other embodiments, all plated through holes 411, 412, 413 include a rivet. The series of plated through holes and pads arranged in the mold gate region of the substrate tend to bind the upper and lower copper layers 408, 410 to the respective cores 403, 401. In examples where a rivet is placed into one or more holes, the rivet has the same effect, tending to bind the upper and lower copper layers to their contiguous cores.

Figure 5:
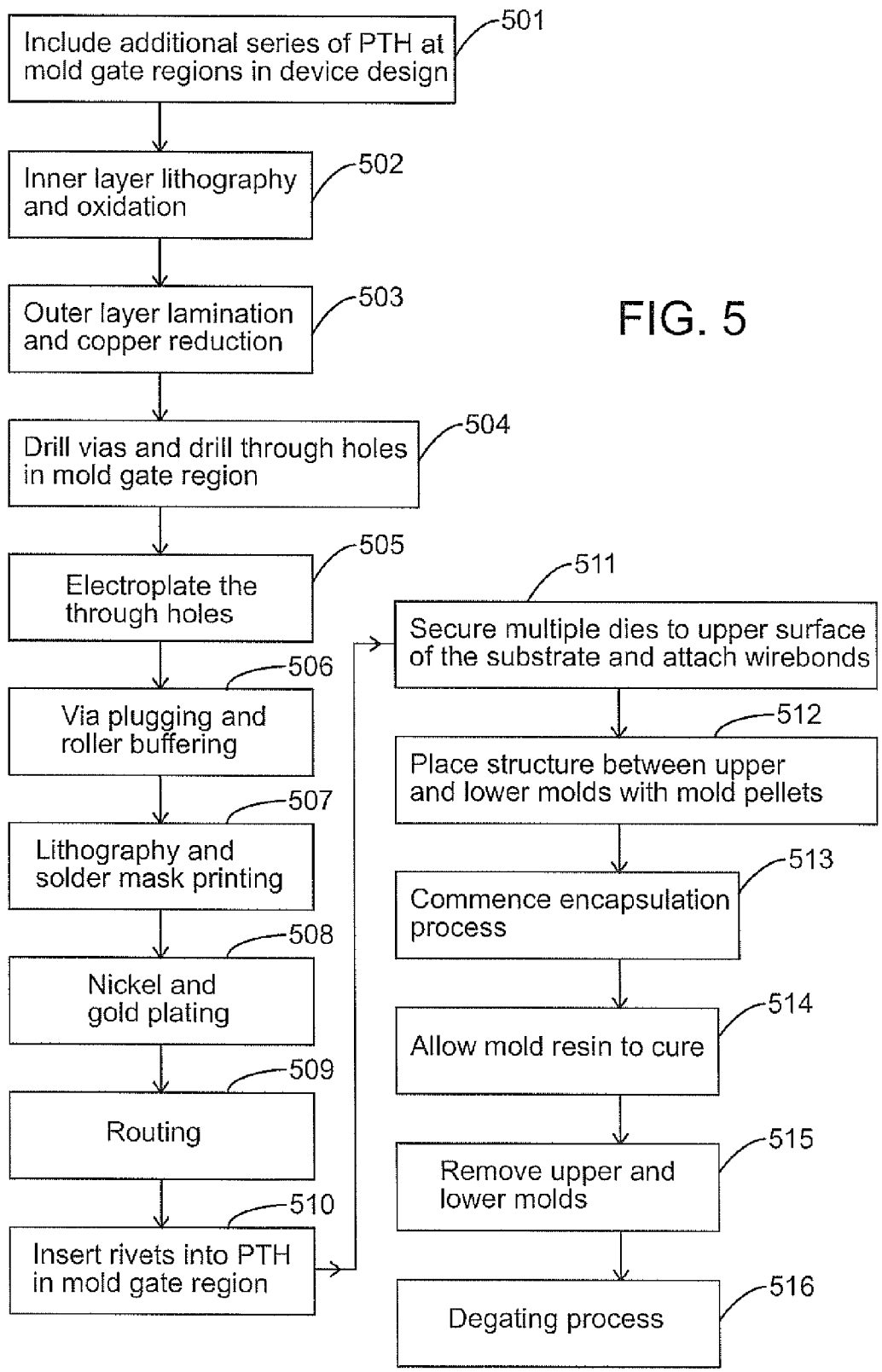
FIG. 5 is a simplified flow chart of an example of a method of manufacturing a semiconductor device structure in accordance with an embodiment of the invention.

Referring now to FIG. 5, an example of a method for manufacturing a semiconductor device structure in accordance with the invention will now be described. The semiconductor device structure may be a ball grid array, for example, manufactured using known techniques but modified to include through holes in a mold gate region. At 501, an additional series of through holes at the mold gate region is included in the design drawings. At 502, an inner layer of the substrate is processed by performing the conventional lithography and oxidation steps. Outer layer processing commences at 503 where lamination and copper reduction are carried out. At 504 vias are drilled. Also at this stage the additional series of through holes are drilled in the mold gate region. Drilling can be done using a laser or mechanical drilling process. At 505 the through holes and vias are electroplated with copper and pads are formed at each end of the plated through holes using a conventional process. At 506 via plugging and roller buffering is performed, as is customary. At 507, lithography and solder mask printing processes are carried out. At 508, nickel and gold plating is done. Gold plate is formed on the mold gate region and also, wirebond bond fingers (intended for conductive wire intermetallic bonding). At 509, a routing step is performed. At 510, rivets are inserted into each plated through hole in the mold gate region using a known technique.

In a next step, at 511, a die is secured to the upper surface of the fabricated substrate and wirebonds are attached as is conventional. A die can be attached using a die epoxy paste or die-attach film. A pair of substrate and die structures is arranged in a fashion similar to that shown in FIG. 1 in order for an encapsulation process to commence.

At 512, the structure is placed between upper and lower molds along with a mold pellet. At 513, an encapsulation process in accordance with known techniques follows. The mold resin is allowed to cure at 514 and subsequently at 515 the upper and lower molds are removed. A conventional degating process follows at 516. Typically, a butterfly action on the structure separates the molding cull from the substrates.

Advantageously, by virtue of the plated through holes and rivets stabilising the substrate at the mold gate region, the possibility of delamination is much reduced. In particular, the gold plating on the mold gate region is more likely to stay intact on degating. The process can be implemented with minimum cost because the formation of the plated through holes in the mold gate region can be done in parallel with other via and through hole and plating steps.

The description of the preferred embodiments of the present invention has been presented for purposes of illustration and description, but is not intended to be exhaustive or to limit the invention to the forms disclosed. It will be appreciated by those skilled in the art that changes could be made to the embodiments described above without departing from the broad inventive concept thereof. It is understood, therefore, that this invention is not limited to the particular embodiment disclosed, but covers modifications within the spirit and scope of the present invention as defined by the appended claims.

The invention claimed is:

1. A semiconductor device package comprising:
   a substrate; and
   a die mounted on the substrate, wherein the substrate includes a peripheral region extending beyond a periphery of the die and defining a mold gate region and wherein the mold gate region includes at least one plated through hole; and
   a pad formed at each end of the plated through hole.

2. The semiconductor device package of claim 1, wherein a plurality of plated through holes is located in the mold gate region.

3. The semiconductor package of claim 1, wherein the plated through hole is electroplated with copper and wherein said pads are copper.

4. The semiconductor device package of claim 1, wherein the through hole contains a rivet.

5. The semiconductor device package of claim 1, wherein the die is encapsulated in a molding compound.

6. The semiconductor device package of claim 1, wherein the substrate is a copper clad laminate.

7. The semiconductor device package of claim 1, wherein at least a portion of a surface of the mold gate region is plated with a conductive metal.

8. A semiconductor device package, comprising:
   a substrate;
   a die mounted on the substrate, wherein the substrate includes a peripheral region extending beyond a periphery of the die and defining a mold gate region and wherein the mold gate region includes at least one through hole; and
   a rivet formed at least at one end of the through hole.

9. The semiconductor device package of claim 8, wherein a plurality of through holes is located in the mold gate region of the die, each of the through holes containing rivets.

10. The semiconductor device package of claim 8, wherein the die is encapsulated in a molding compound.

11. The semiconductor device package of claim 8, wherein the substrate is a copper clad laminate.

12. The semiconductor device package of claim 8, wherein at least a portion of a surface of the mold gate region is plated with a conductive metal.

13. A method for manufacturing a semiconductor device package, the method comprising:
- mounting a die on a substrate so that a peripheral region of the substrate extends beyond the die to form a mold gate region; and
- drilling at least one through hole in the mold gate region to produce a drilled, substrate-die arrangement.

14. The method of claim 13, comprising:
- electroplating the at least one drilled through hole and forming conducting pads at each end thereof on upper and lower surfaces of the mold gate region.

15. The method of claim 13, comprising inserting a rivet into the at least one drilled through hole.

16. The method of claim 13, further comprising:
- placing a plurality of drilled substrate-die arrangements in a mold;
- filling the mold with encapsulating material;
- curing the encapsulating material;
- removing the mold to leave an array of encapsulated devices connected together by a molding cull; and
- removing the molding cull using a degating process.

* * * * *